United States Patent

[11] 3,585,466

[72] Inventors John R. Davis, Jr.
Export;
Terence R. Kiggins, Latrobe, both of, Pa.

[21] Appl. No. 782,600
[22] Filed Dec. 10, 1968
[45] Patented June 15, 1971
[73] Assignee Westinghouse Electric Corporation
Pittsburgh, Pa.

[54] RESONANT GATE TRANSISTOR WITH IMPROVED GAIN HAVING A VIBRATORY MEMBER DISPOSED IN A SPACED RELATIONSHIP BETWEEN A FIELD RESPONSIVE MEMBER AND A FIELD PLATE
5 Claims, 2 Drawing Figs.

[52] U.S. Cl. .......... 317/235,
317/234, 179/111, 332/31
[51] Int. Cl. .......... H01l 11/00,
H01l 15/00
[50] Field of Search .......... 317/234,
235, 21.1, 26; 179/110, 111; 332/31 T

[56] References Cited
UNITED STATES PATENTS

| | | | |
|---|---|---|---|
| 3,236,957 | 2/1966 | Karmann et al. .......... | 179/110 |
| 3,403,307 | 9/1968 | Rindner .......... | 317/235 |
| 3,413,573 | 11/1968 | Nathanson et al. .......... | 332/31 |
| 3,436,492 | 4/1969 | Reedy .......... | 317/235 |

*Primary Examiner*—John W. Huckert
*Assistant Examiner*—Andrew J. James
*Attorneys*—A. T. Stratton, C. L. Menzemer and G. H. Telfer

ABSTRACT: A resonant gate transistor with high gain is provided by a structure with a field plate oppositely disposed to the field responsive means (such as a field effect transistor) in relation to the vibratory member positioned therebetween.

INVENTORS
John R. Davis, Jr. &
Terence R. Kiggins
BY
Gordon H. Telfer
ATTORNEY

RESONANT GATE TRANSISTOR WITH IMPROVED GAIN HAVING A VIBRATORY MEMBER DISPOSED IN A SPACED RELATIONSHIP BETWEEN A FIELD RESPONSIVE MEMBER AND A FIELD PLATE

GOVERNMENT CONTRACT ACKNOWLEDGMENT

This invention was made in the course of work under a contract with the Department of the Air Force.

BACKGROUND OF THE INVENTION

1. Field of the Invention

This invention relates to frequency selective apparatus for microelectronic devices employing a vibratory member and means responsive thereto.

2. Description of the Prior Art

A device known as a resonant gate transistor (RGT) is described in U.S. Pat. No. 3,413,573, Nov. 26, 1968, by Nathanson and Wickstrom and also in an article by Nathanson et al. in *IEEE Transactions Electron Devices*, Volume ED–14, pages 117—133, Mar. 1967, as well as in other publications. This prior art discloses a device including a vibratory member, such as a cantilever, used to control a field responsive element, such as a surface potential controlled transistor. An input signal at a resonant frequency of the vibratory member affects the output of the responsive element in a frequency selective manner. The input signal is applied to a conductive member, called a field plate, that electrostatically induces vibration in the vibratory member. In embodiments disclosed by the prior art, the field plate is a conductive layer on the substrate and laterally spaced from the field responsive element.

While resonant gate transistors in accordance with the prior art have been successfully made and operated, they have been limited for some applications because they have exhibited low gain or high insertion loss. The device typically provides an output of around 100 millivolts with an input of 1 volt. Since there is noise at the output of the device on the order of 1 to 2 millivolts, this limits the useful dynamic range to about 30 db. or 40 db.

SUMMARY OF THE INVENTION

This invention has among its objects that of providing a resonant gate transistor with higher gain and lower insertion loss than is available in prior resonant gate transistors. By this invention the effective transfer gain of the device is improved by relocation of the field plate with respect to the field responsive element. In particular, the field plate is located with the vibratory member between it and the field responsive element such as by spacing the field plate above the vibratory member rather than having it disposed on the substrate and laterally spaced from the field responsive element. Furthermore, it is preferred that the field responsive element and the field plate both extend over a major portion of the length of the vibratory member. In instances in which the vibratory member is a cantilever it is especially helpful that the field plate and the field responsive element be located at least at the free extremity of the cantilever.

DESCRIPTION OF THE PREFERRED EMBODIMENTS

Figure 1:
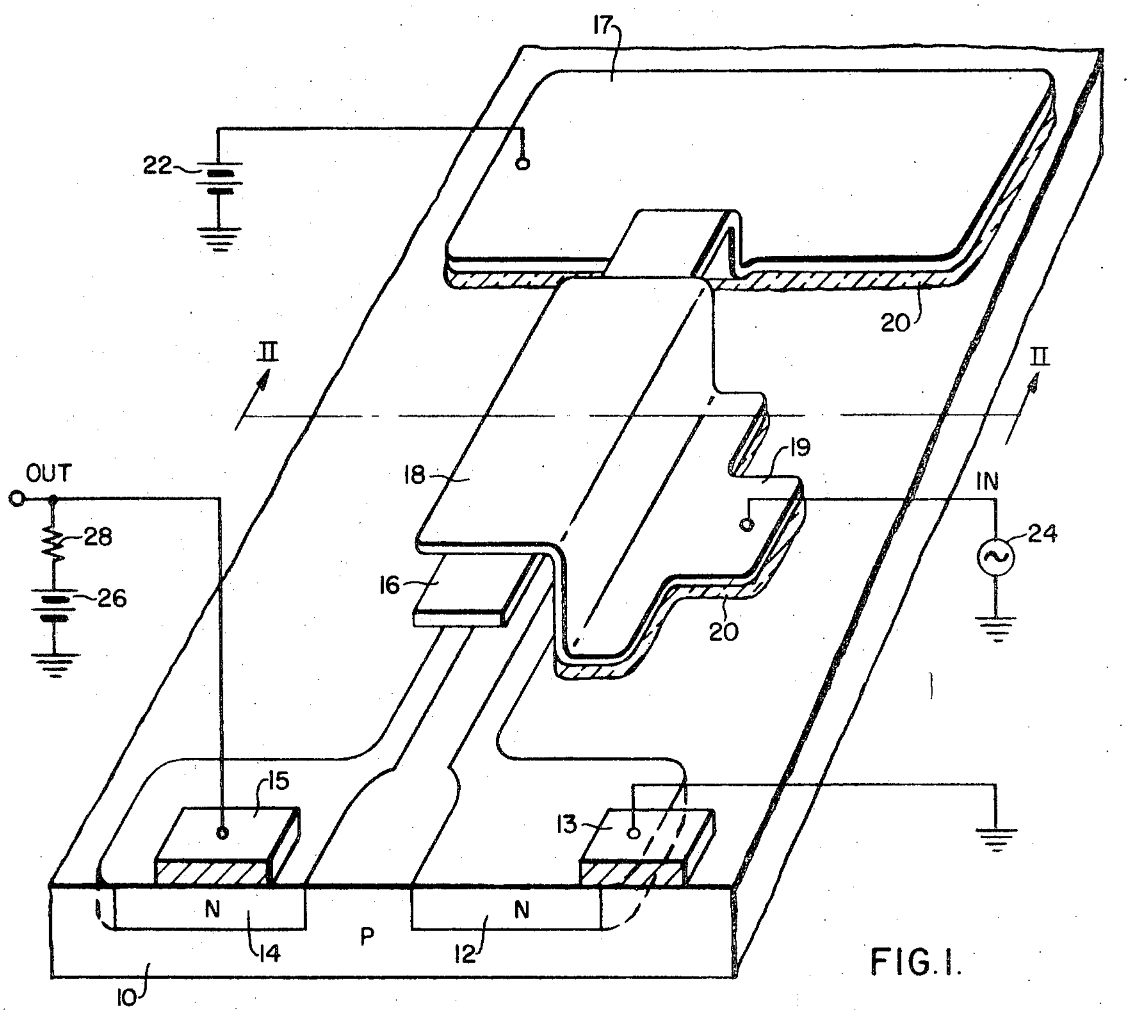
FIG. 1 is a partial perspective view of an embodiment of this invention with schematically shown circuit connections.
Figure 2:
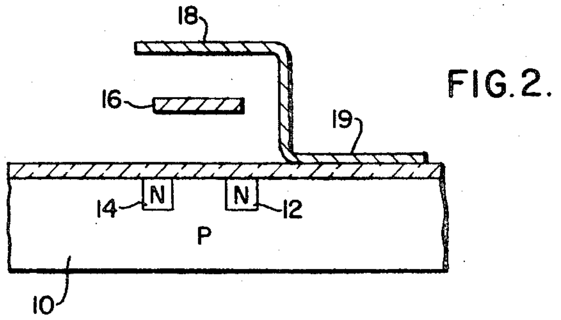
FIG. 2 is a sectional view of the structure of FIG. 1 taken along the line II–II.

Referring to FIGS. 1 and 2 there is shown a substrate 10 that in this example is a body of semiconductive material of P-type conductivity having therein regions 12 and 14 of N-type conductivity to serve the source and drain regions, respectively, of an insulated gate field effect transistor. Contacts 13 and 15 are made to the regions 12 and 14, respectively. Contact 13 shorts regions 12 to the substrate in accordance with field effect transistor practice. A vibratory member 16, in this example a cantilever, has one extremity affixed to the surface of the substrate 10 at conductive pad 17 with the remainder free to move in relation to the substrate and being comprised of conductive material so that it can be electrostatically energized. Means for inducing vibration in the vibratory member 16 is provided comprising a conductive field plate member 18 extending over and spaced from the free portion of the cantilever 16. Both the pad 17 which the cantilever 16 is joined and the field plate mounting pad 19 are insulated from the semiconductor such as by a layer 20 of silicon dioxide that would ordinarily cover the entire surface except where direct contact to the semiconductor is made.

The operation of the device is basically as described in the above mentioned patent and literature. A polarizing voltage is applied to the cantilever 16 such as by a battery 22 connected to pad 17. The input signal is applied to the field plate member 18 by a source 24 of alternating signals connected to pad 20. A battery 26 and load resistor 28 provide the working current in the channel of the field effect transistor between regions 12 and 14 which is modulated by means of the vibratory member 16 to produce an output signal.

As opposed to the prior art configurations wherein the field plate also was disposed on the substrate laterally spaced from the field responsive element, structures in accordance with this invention provide substantially higher gain and lower insertion loss. Briefly this can be explained as follows. The ratio of the output voltage to the input voltage is that it is desired to maximize. A vibratory member inherently exhibits greater amplitude of deflection remote from the point (or points) at which it is fixed. For example, with a cantilever. deflection one-quarter of the distance from the fixed end is only one-eighth that of the amplitude three-quarters of the way from the fixed end. This indicates improved performance by locating elements affecting and affected by the amplitude of deflection at or near the free extremity of the vibratory member. However, the field plate and the field effect transistor both coreact with the vibratory member so they necessarily may not be at the position of maximum amplitude where they are laterally spaced in the substrate. A compromise may be made by enlarging the area of the field plate relative to that of the field responsive device. This proportionately increases the gain but simultaneously the detector impedance and therefore its noise level are increased.

An improved relationship is achieved by this invention through the use of the spaced field plate 18 above the vibratory member 16 so that it may occupy the full area effectively occupied by the field effect transistor. Source and drain regions 12 and 14 may extend along the entire length of the beam 16. Thus both the input plate and the output element may interact with all of the cantilever length.

The transfer gain of this device is improved by a factor of about 8 by having both the input and output areas near the free end of the beam and an additional increase of about 10 percent results from doubling the input plate area. Further, the output impedance is lowered by a factor of about 2. The net result is a gain increase by a factor of about 9 (about 19 db.). The load impedance increases the signal to noise ratio by 2 (6 db.). This totals an increase in the dynamic range of about 25 db.

Such devices have been made wherein the cantilever resonant frequency was 40 kiloHertz, the polarization voltage was 30 volts, the field responsive element was an N channel normally on MOS transistor, the impedance of the field responsive element was 100 kilohms, the drain supply voltage was 30 volts and a load resistor was used matched to the transistor impedance. The cantilever thickness was 12 microns, its length 0.33 millimeters, and its width 38 microns. Test results have indicated device gains from −30 to −45 db. on units with cantilever to substrate spacings of 4 to 5 microns. Higher gains can be achieved with smaller beam to substrate spacing.

Vibration of the field plate 18 is not a problem since it may readily be formed with such a different resonant frequency than that of the beam 16 that it is fixed for all frequencies with which the device may be operated. Normally the free portion of the field plate 18 is considerably shorter and stiffer than the beam 16. However, if desired for any purpose, the field plate may also be dimensioned to provide resonance at a chosen frequency.

Various modifications and applications of devices in accordance with this invention will be apparent by reference to the above-mentioned patent and literature which should be referred to for fuller description of the nature and uses of resonant gate transistors.

Structures in accordance with this invention may be fabricated in accordance with the teachings of the above referred to patent and publications as well as in accordance with the teachings of copending application Ser. No. 733,582, filed May 31, 1968, by Nathanson and Davis and assigned to the assignee of the present invention, specifically with respect to its description of the formation of multiple levels of spaced conductors on a microelectronic scale.

We claim:

1. Frequency selective apparatus comprising: a substrate consisting of a semiconductor material; a vibratory member having a first and a second portion affixed to but electrically insulated from said substrate and form of an integral piece of material, said first portion being said second portion being space above said substrate and free to move in relation to said substrate, at least said second portion of said vibratory member comprising electrically conductive material; field responsive means on said substrate positioned under said second portion of said vibratory member.; and means for inducing vibration in said vibratory member comprising a conductive member, said conductive member having a first and a second portion formed of an integral piece of material, said first portion being affixed to but electrically insulated from said substrate, said second portion of said conductive member extending over and spaced from said second portion of said vibratory member whereby when a polarizing voltage is applied to the vibratory member and an input signal is applied to the conductive member a current in the field responsive means is modulated by the second portion of the vibratory member to produce an output signal.

2. The subject matter of claim 1 wherein: said field responsive means and said conductive member are positioned directly opposite each other.

3. The subject matter of claim 2 wherein: said field responsive means and said conductive member extend along a major portion of the length of said vibratory member.

4. The subject matter of claim 1 wherein: said field responsive means is an insulated gate field effect transistor.

5. The subject matter of claim 1 wherein: said vibratory member is a cantilever; said field responsive means and said conductive member are located at least at the free extremity of said cantilever.